United States Patent [19]

Takahashi et al.

[11] Patent Number: 5,143,253
[45] Date of Patent: Sep. 1, 1992

[54] CHIP PACKAGING MEANS AND SUPPLY MECHANISM FOR SUPPLYING CHIPS BY USING THE CHIP PACKAGING MEANS

[75] Inventors: Kuniaki Takahashi; Koji Kudo; Tetsuo Takahashi, all of Tokyo, Japan

[73] Assignee: TDK Corporation, Tokyo, Japan

[21] Appl. No.: 402,041

[22] Filed: Sep. 1, 1989

[30] Foreign Application Priority Data

Sep. 2, 1988 [JP] Japan ............................ 63-115835[U]
Feb. 23, 1989 [JP] Japan ............................ 1-20975[U]
Apr. 26, 1989 [JP] Japan ............................ 1-49038[U]
Apr. 28, 1989 [JP] Japan ............................ 1-51491[U]
Jul. 28, 1989 [JP] Japan ............................ 1-195957

[51] Int. Cl.$^5$ ............................................. B65H 1/00
[52] U.S. Cl. ................................... 221/197; 221/236; 221/278; 221/287
[58] Field of Search ............... 221/278, 287, 155, 197, 221/224, 236, 289, 290, 200; 206/328, 332, 334; 29/809, 740, 759

[56] References Cited

U.S. PATENT DOCUMENTS 4,567,652 2/1986 Gussman et al. .................. 29/759 X
4,801,044 1/1989 Kubota et al. .................. 221/278 X
4,953,749 9/1990 Kubota et al. .................. 221/278 X

FOREIGN PATENT DOCUMENTS 3148990 6/1983 Fed. Rep. of Germany ...... 221/278

Primary Examiner—David H. Bollinger
Attorney, Agent, or Firm—Helfgott & Karas

[57] ABSTRACT

A chip packaging casing for packing chips and also serving as a chip supply source comprises a substantially plate-like body having a spiral passageway formed in its interior, and a plurality of chips received in a row in the spiral passageway of the body. The plate-like body further has a chip-outlet formed therein as a continuation of the spiral passageway to communicate with the exterior of the body and at least one air-intake formed therein to communicate between the passageway and the exterior of the body. The air-intake is adapted to be connected to an air supply source and serves to facilitate the forwarding of the chips along the passageway toward the outlet to discharge the chips form the outlet. A chip supply mechanism is provided for supplying chips to a mounting head of an automatic chip mounting apparatus by using the chip packaging casing.

26 Claims, 15 Drawing Sheets

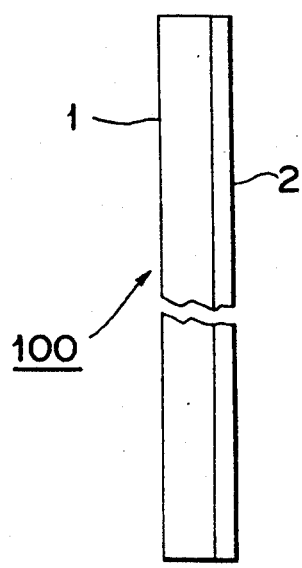
FIG. 1
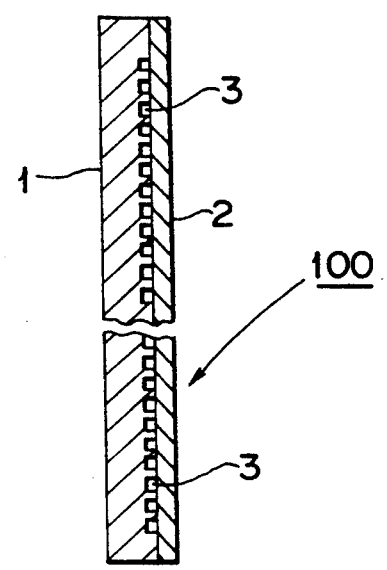
FIG. 3
FIG. 2
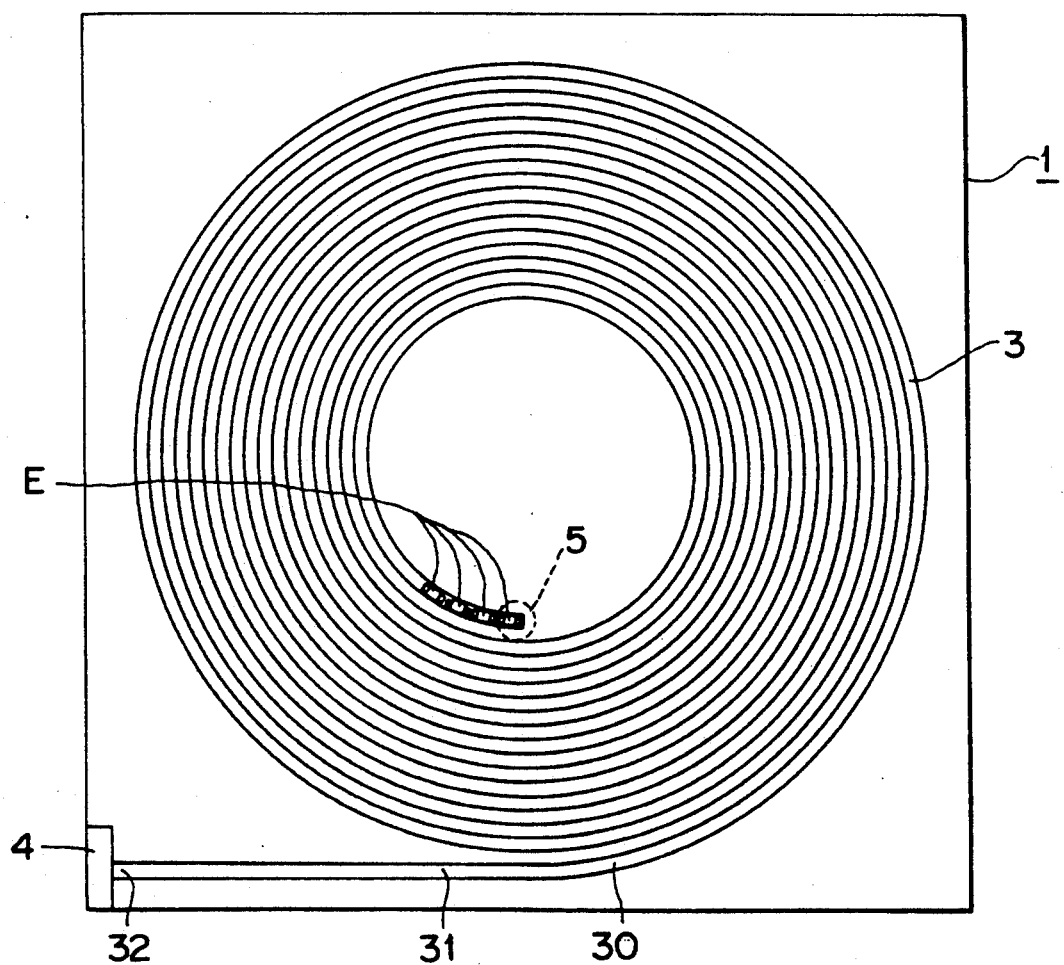

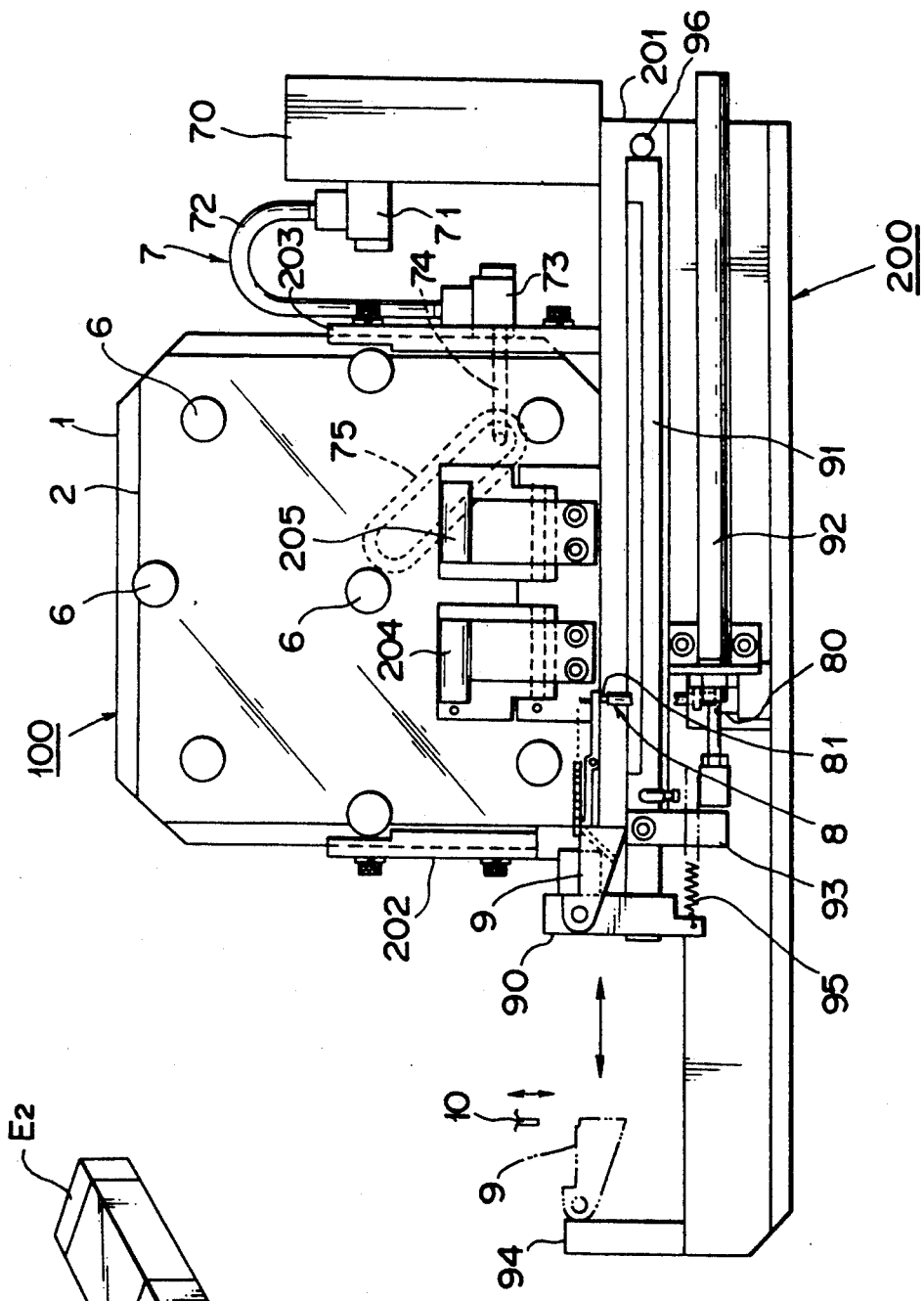

CHIP PACKAGING MEANS AND SUPPLY MECHANISM FOR SUPPLYING CHIPS BY USING THE CHIP PACKAGING MEANS

BACKGROUND OF THE INVENTION

1. Field of the Invention

This invention relates to chip packaging means packing chip-tupe elecronic components (hereinafter referred to as "chips") and supply mechanism for supplying chips by using the package means. More prticularly, this invention relates to packaging means packing chips for storage and transportion and also used as supply source to feed chips to a mounting head of an automatic chip mounting apparatus when the mounting head is to mount chips on printed circuit boards, and supply mechanism for supplying chips to the mounting head by using the packaging means.

2. Description of the Prior Art

Generally, as forms of packaging chips, taping, magazine-type packaging, pouch packaging and the like are well known. Alternately, bulk-type packaging, in which chips are randomly contained within a case and are adapted to be discharged out of the case one by one and fed to a mounting head when the mounting head is to mount chipd on printed circuit boards, is disclosed in Japanese Laid-Opened Patent Application Nos. 280129/1987, 22378/1988, 82974/1988 and 82975/1988. In the conventional bulk-type packaging, the case has a three-dimensional space of a rectangular shape and chips are randomly stored within the space of the case. The feeding of the chips to a mounting head is carried out by causing the case to be obliquely arranged and feeding air to the case or causing the case to be vibrated to discharge the chips one by one from an outlet which is formed in the case. Also, the feeding of the chips to the mounting head is performed by preparing a case which has a space for receiving chips therein, the chips randomly received in the space, and a chip outlet, and an oblique passage member extendinng in a downward direction as a continuation of the outlet, and feedihng air to the case or causing the case to be vibrated to discharge the chips one by one through the outlet to the passage member. However, in the conventional packaging case, the chips are randomly received in the space of the case and adapted to be moved to the outlet of the case, so that when the chips pass through the outlet of the case one by one, the chips may be caught by a wall of the case which constitutes the outlet, whereby the chips may be prevented from being smoothly discharge out of the case through the outlet of the case.

SUMMARY OF THE INVENTION

The present invention has been made in view of the foregoing disadvantage of the prior art.

It is therefore an object of the present invention to provide chip packaging means, which can facilitate smooth discharging of chips out of a case.

It is another object of the present invention to provide chip packaging means, which is simple and can be formed easily.

It is still another object of the present invention to provide chip packaging means which can facilitate easy and efficient feeding of chips to a chip mounting head of an automatic chip mounting apparatus.

It is yet another object of the present invention to provide a chip feeding mechanism for feeding chips to a chip mounting head of an automatic chip mounting apparatus, which can easily and efficiently feed chips to the mounting head by using the chip packaging means as stated above.

BRIEF DESCRIPTION OF THE DRAWINGS

FIG. 1 is a side view of chip packaging means according to a first embodiment of the present invention;

FIG. 2 is a top plan view of a casing body;

FIG. 3 is a sectional view of the chip packaging means;

FIG. 12 is a schematic perspective view showing a chip;

FIG. 13 is a schematic front view showing a chip supply mechanism;

DETAILED DESCRIPTION OF THE PREFERRED EMBODIMENTS

Figure 4:
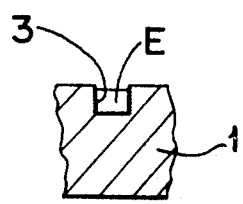
FIG. 4 is a fragmentary sectional view of the casing body.
Figure 5:
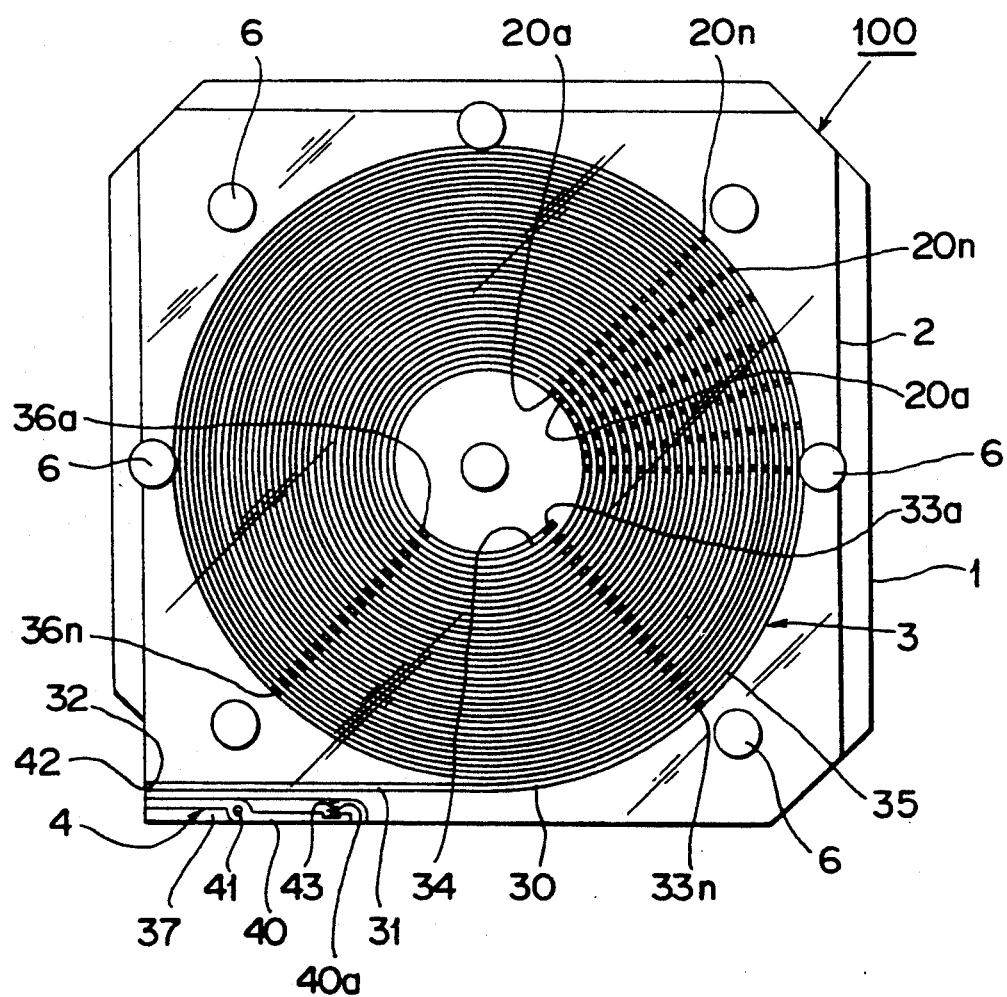
FIG. 5 is a plan view of chip packaging means according to a second embodiment.
Figure 6:
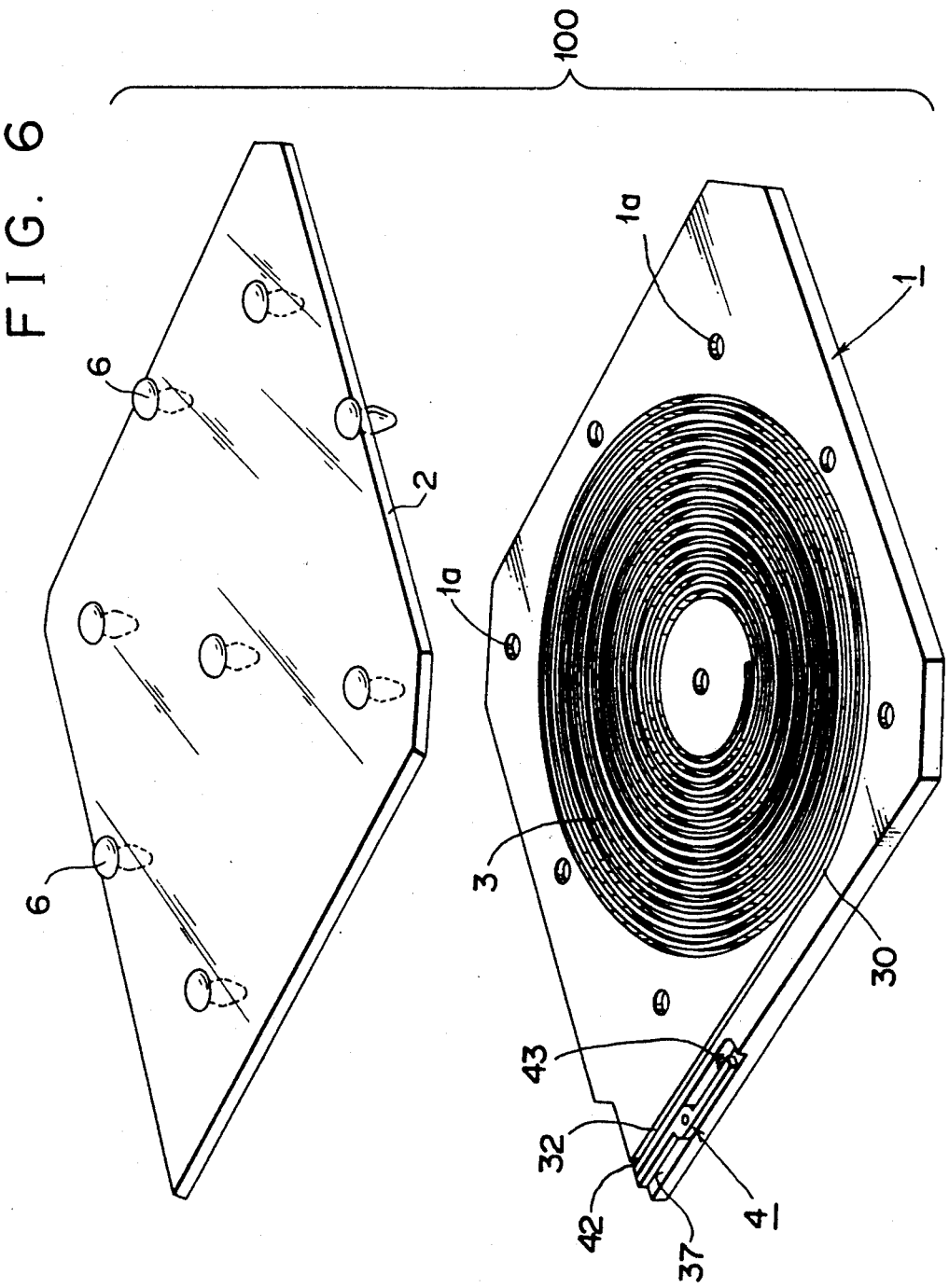
FIG. 6 is an exploded perspective view of the chip packaging means.
Figure 7:
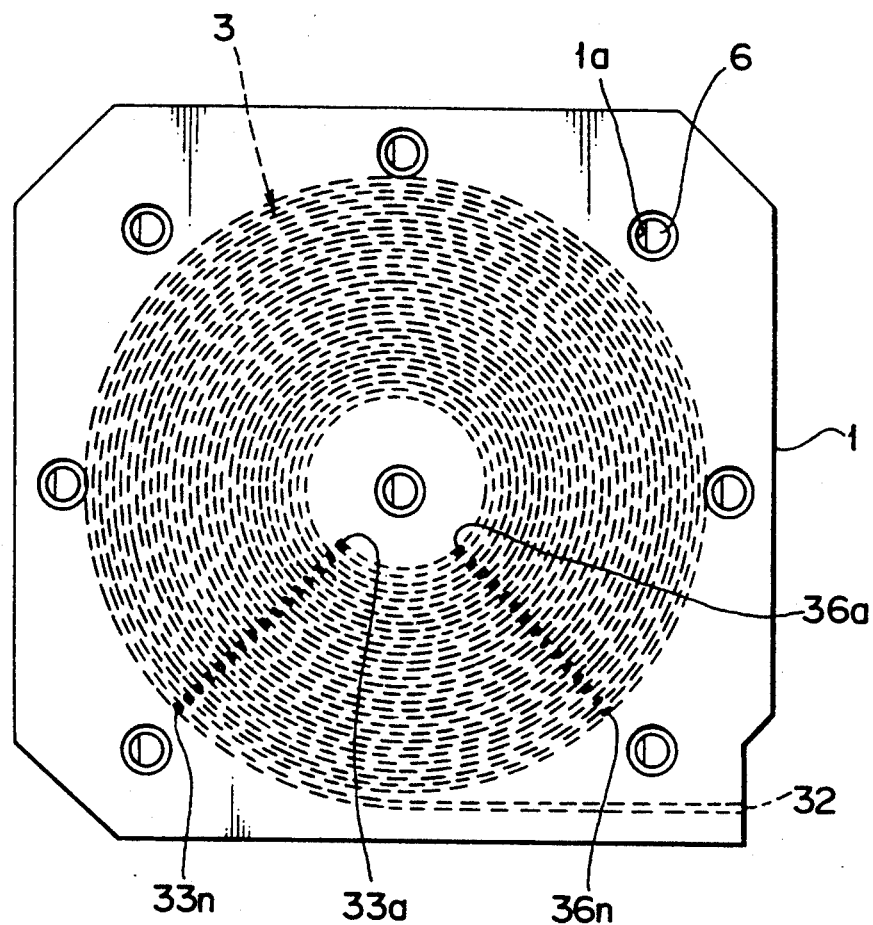
FIG. 7 is a rear elevation view of the chip packaging means.

Referring to FIGS. 1 to 4, description will be made at first of chip packaging means according the first embodiment of the present invention. The chip packaging means 100 comprises a substantially plate-like casing body 1 for containing a plurality of chips, and a cover plate 2 arranged on one surface of the casing body 1 as shown in FIGS. 1 and 3. The casing body 1 is formed with a groove 3 of a substantially spiral shape in its one surface side, on which the cover plate is put, as shown in FIG. 3. In the illustrated embodiment, the spiral groove 3 is formed in the casing body 1 only. However, such spiral groove 3 may be formed in each of surface sides of the casing body 1 and cover plate 2 which are opposite to each other when the cover plate 2 is put on the casing body 1 for assembly. As shown in FIG. 4, the chip packaging means 100 further includes a plurality of chips E (only one is shown in FIG. 4), e.g., chip-type capacitors, chip-type resistors or the like, received in a row in the spiral groove 3 of the casing body 1. The groove 3 of the casing body 1 is of a width slightly more than that of each chip E and is of a height relatively more than a thickness of each chip E.

The spiral groove 3 may be formed in the casing body 1 in a manner such that a bottom surface of the spiral groove 3 gradually descends from its central portion toward its outside circuylar portion. The chips E received in the spiral groove 3 are adapted to slide on the bottom surface of the spiral groove 3 as described in greater detail hereinafter. When the chips E slide on the bottom surface of the spiral groove 3, static electricity may be produced between the chips E and the spiral groove 3 due to friction, resulting in the chips E being prevented from smoothly sliding on the bottom surface of the spiral groove 3. In order to avoid producing of such static electricity between the chips E and the groove 3 when the chips E slide on the bottom surface of the groove 3, the walls of groove 3 may be coated with, e.g., fluorine. An outside terminal portion 30 of the groove 3 communicates through a linear groove 31, which is formed in a protion of the casing body, 1 with a chip outlet 32 for discharging the chips E one by one therethrough, which outlet 32 is formed at one side of the casing body 1. At the outlet 32 of the casing body 1, shutter means 4 is provided. The chips E are discharged one by one out of the casing body 1 from the outlet 32 by closing and opening the outlet 32 through actuation of the shutter means 4. At an inside terminal portion of the groove 3, an opening (not shown) is formed, in which a threaded plug 5 is removably threaded. The plug 5, when chips E are to be crammed into the groove 3, is removed from the opening, through which the chips are crammed into the groove 3 of the casing body 1.

Incidentally, the casing body 1 and the cover plate 2 may be each made of, e.g., plastic material, paper, expanded polystyrene, or aluminum, whereby the chip packaging means 100 itself is lightweight. Also, at least the cover plate 2 is made of transparent plastic material, to thereby permit viewing the interior of the packaging means 100. The casing body 1 is preferably made of, for example, polyacetal in order to facilitate smooth sliding of the chips on the bottom surface of the groove 3.

In the chip packaging means 100 constructed in the manner as described above, chips E may be crammed into the spiral groove 3 of the casing body 1 subsequently to a manufacturing process of the chips. Alternatively, the chips may be crammed into the groove 3 of the casing body 1 at a separate stage.

The packaging means 100 constructed in the manner as described above serves as means to package chips for storage and transportation, and also serves as a chip supply source. The chip packaging means 100 can be marketed as it is. When the packaging means 100 is used as a chip supply source, it is installed in a chip supply mechanism. The chip supply mechanism is adapted to supply air into the groove 3 of the packaging means 100 to cause the chips E received in the groove 3 of the packaging means 100 to slide on the bottom surface of the groove 3 and cause the chips E one by one to be discharged from the outlet 32. For this purpose, the chip supply mechanism includes an air supply source, to which the groove 3 of the chip packaging means 100 is connected. Also, the chip supply mechanism may include an air absorbing source. More particularly, in the illustrated embodiment, the casing body 1 is formed at the inside terminal portion of the groove 3 with through-holes (not shown), to which through-holes the air supply source is connected, and the air absorbing source is connected to the outlet 32 of the casing body 1, so that when air is supplied to the groove 3 at the inside terminal portion of the groove 3 from the air supply source and vacuum is applied to the groove 3 at the outlet 32 by the air-absorbing source, the chips slide on the bottom surface of the groove 3 along the spiral groove 3 to be smoothly discharged from the outlet 32. In lieu of the air supply source and air-absorbing source, vibration applying means may be employed. The vibration applying means serves to apply vibration to the chips packaging means 100 to cause the chip to slide on the bottom surface of the groove 3 and cause the chips to be discharged from the outlet 32. The vibration applying means includes piezoelectric vibrators. When small-sized piezoelectric vibrators are employed, they may be attached onto the casing body 1 and/or the cover plate 2. Also, in the case where a plurality of small-sized piezoelectric vibrators, different in vibration frequency from one another, are employed and arranged in a row along a portion of a back slide of the casing body 1, which positionally corresponds to the groove 3 and/or a portion of the cover plate 2 which positionally corresponds to the groove 3, vibrations having variation in magnitude can be applied to the packaging means 100, whereby the chips smoothly slide on the bottom surface of the groove 3 to be securely discharged from the outlet 32. More particularly, when vibrations are applied to the chip packaging means 100 by the vibration applying means, the chips are moved toward the outlet 32 of the casing body 1 and are discharged one by one from the outlet 32 each time the outlet 32 of the casing body 1 is opened by the shutter means 4.

The chips E are received in a row in the groove 3 of the casing body 1 as described above, so that they are securely moved toward the outlet 32 of the casing body 1 due to air supplied from the air supply source or vibrations applied by the vibration applying means, and are securely discharged one by one from the outlet 32 of the casing body 1. The chips discharged one by one from the outlet 32 in the manner as described above are fed to a chip mounting head of an automatic chip mounting apparatus.

Chip packaging means according to a second embodiment of the present invention is shown in FIGS. 5 to 10. In the second embodiment of FIGS. 5 to 10, parts which are similar to those shown in FIGS. 1 to 4 are denoted by the same designators and the description of them will not be repeated.

Figure 8:
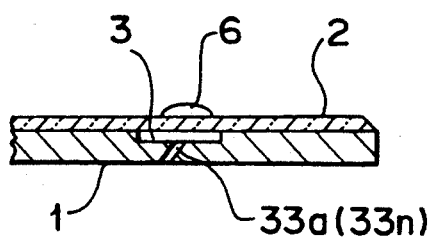
FIG. 8 is a fragmentary sectional view of the chip packaging means.

Referring to FIGS. 5 to 10, the casing body 1 is formed with a series of air-intakes 33a to 33n which are formed in the casing body 1 along a radial direction from the inside terminal portion 34 of the spiral groove 3 to an outside circular portion 35 of the groove 3 and disposed at bottom portions of respective circular portions of the spiral groove 3. The air-intakes 33a to 33n communicate with a coupling which is attached on a back side of the casing body 1 and connected to an air supply source as described in greater detail hereinafter, so that the air from the air supply source is fed into the groove 3 through the air-intakes 33a to 33n. As shown in FIG. 8, each of the air-intakes 33a to 33n preferably formed in a manner to ascend obliquely from the back side of the casing body 1 in the direction in which the chips are moved toward the outlet 32 by the air from the air supply source. The casing body 1 is further formed with a series of air-outtakes 36a to 36n which take the form of through-holes. The air-outtakes 36a to 36n are formed at the bottom portions of the respective circular portions of the spiral groove 3 in a manner to be disposed in a row in the radial direction from an innermost circular portion of the groove 3 to the outermost circular portion 35 of the groove 3 and serve as means to discharge the air therethrough out of the casing body 1 to regulate air pressure in the groove 3. Where each of the air-outtakes 36a to 36n is formed in a manner to ascend obliquely from the back side of the casing body 1 to the groove 3 in a direction reverse to the chip moving direction, the discharge amount of air can be suitably set.

Figure 9:
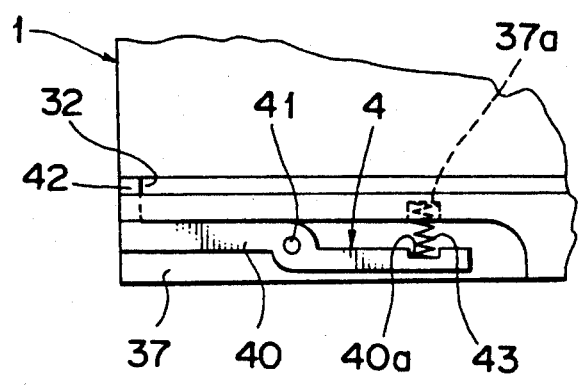
FIG. 9 is a fregmentary plan view of shutter means.
Figure 10:
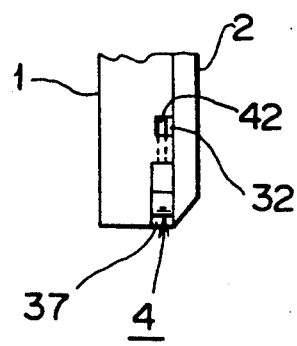
FIG. 10 is a fragmentary side view of the shutter means.

As shown in FIGS. 9 and 10, the shutter means 4 includes an elongate body 40 received in a cutout portion 37 which is formed at a portion of the casing body 1 near the outlet 32 and pivotally connected at its middle portion to the casing body 1 through a support pin 41, a stopper pawl 42 provided at one end portion of the elongate body 40 and projecting in the outlet 32, and a spring 43 arranged between a cutout portion 40a and, which is formed at the other end portion of the elongate body 40, a recess portion 37a which is formed in a rising wall of the cutout 37. The stopper pawl 42 is in the outlet 32 due to the action of the spring 43 to close the outlet 32. When the elongate body 40 is pushed at the other end portion thereof by means of an ejector pin (described in greater detail hereinafter) to be rotated about the pin 41 in a counterclockwise direction against the action of the spring 43, the stopper pawl 42 is released from the outlet 32, resulting in the outlet 32 being opened. Such actuation of the shutter means 4 is performed synchronously with the feeding of air into the groove 3 through the air-intakes 33a to 33n by the air supply source.

Incidentally, in addition to the air-outtakes 36a to 36n, a cluster of air-outlets 20a to 20n may be formed in the cover plate 2. The air-outlets 20a to 20n take the form of through-holes. The air-outlets 20a to 20n are formed at portions of the cover plate 2, which positionally correspond to the respective circular portions of the spiral groove 3 of the casing body 1, in a manner to be disposed in rows in the radial directions.

The cover plate 2 is removably mounted on the spirally grooved surface of the casing body 1 by means of a plurality of anchor clips 6, so that when the chips are to be crammed into the spiral groove 3 of the casing body 1, the cover plate can be easily separated from the casing body 1.

Figure 11:
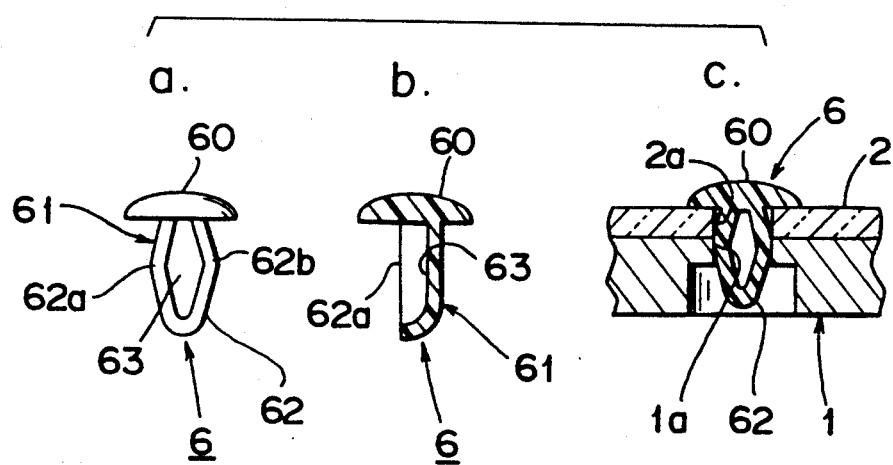
FIG. 11a to 11c are each a schematic view of assistance in explaining an anchor clip.
Figure 15:
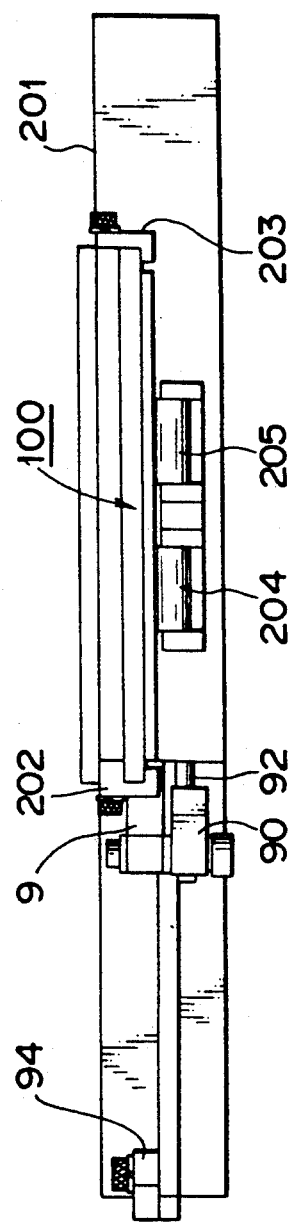
FIG. 15 is a schematic plan view of the chip supply mechanism.

Referring now to FIGS. 11a to 11c, each of the anchor clips 6 comprises a head portion 60 and a post portion 61 depending downwardly from the head portion 60. The post portion 61 includes a substantially loop-shaped portion 62 and a web portion 63 integrally formed between one surfaces of both sides 62a and 62b of the substantially loop-shaped portion 62. The both sides 62a and 62b of the substantially loop-shaped portion 62 are protruded outwardly at their substantially middle portions. At least the post portion of the anchor clip 6 is made of flexible material to be deformable. The cover plate 2 is removably mounted on the casing body 1 by putting the cover plate 2 on the spirally grooved surface of the casing body 1 and fitting the anchor clips 6 into respective through-holes 2a, which are formed in predetermined portions of the cover plate 2, and respective through-holes 1a which are formed in predetermined portions of the casing body 1. When each of the anchor clips 6 is fitted into the corresponding through-hole 2a of the cover plate 2 and the through-hole 1a of the casing body 1, the web portion 63 of the anchor clip is deformed, so that fitting operation of the anchor clips 6 into the respective through-holes 2a and 1a can be easily performed. Also, plucking out of the anchor clips 6 from the respective through-holes 2a and 1a can be easily performed while deforming the web portions 63.

One example of chips E to be packed in the spiral groove 3 of the casing body 1 is shown in FIG. 12. When a plurality of the chips are to be packed in the groove 3 of the casing body 1, the cover plate 2 is removed from the casing body 1 by plucking out of the anchor clips 6 from the respective through-holes 2a and 1a. Packing operation of the chips into the groove 3 of the casing body 1 is easily carried out by putting the chips on the casing body 1 and vibrating the casing body 1 in order to cause the chip to be moved into the groove 3 of the casing body 1. Also, the packing operation of chips into the groove 3 of the casing body 1, may be carried out subsequently to a process of producing of the chips. When each of the chips is to be crammed into the groove 3 of the casing body 1, it may be fed into the groove 3 with its electrodes E1 and E2 facing in a longitudinal direction of the groove 3 or may be fed into the groove 3 with its electrodes E1 and E2 facing in a transversal direction of the groove 3.

When the chip packaging means 100 constructed in the manner as described above, is used, it is installed in a chip supply mechanism for supplying chips one by one to a mounting head of an automatic chip mounting apparatus. The chip supply mechanism is shown in FIGS. 13 to 16.

Referring to FIG. 13, the chip supply mechanism 200 includes an air supply mechanism 7 and an actuating mechanism 8 for actuating the shutter means 4 of the packaging means 100. the air supply mechanism 7 includes an air valve 70 mounted on a base 201 of the chip supply mechanism 200 and having a joint 71, a pipe 72 of a substantially inverted U-shape, connected at its one end to the joint 71 of the air valve 70, a joint 73 connected to the other end of the pipe 72, a pipe 74 extending from the joint 73, and a coupling 75 connected to a tip end of the pipe 74 and having an opening of a size sufficient to surround all of the air-intakes 33a to 33n of the chip packaging means 100.

Figure 14:
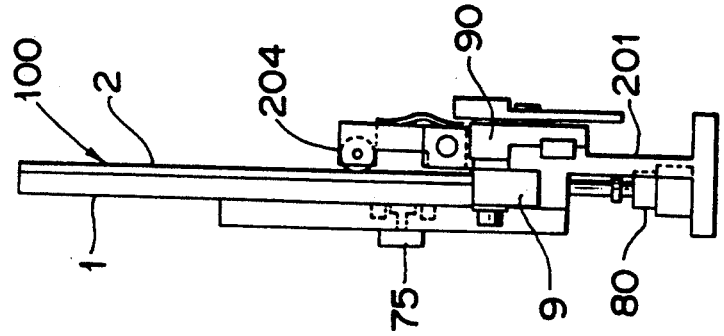
FIG. 14 is a schematic side view showing the chip supply mechanism.
Figure 17:
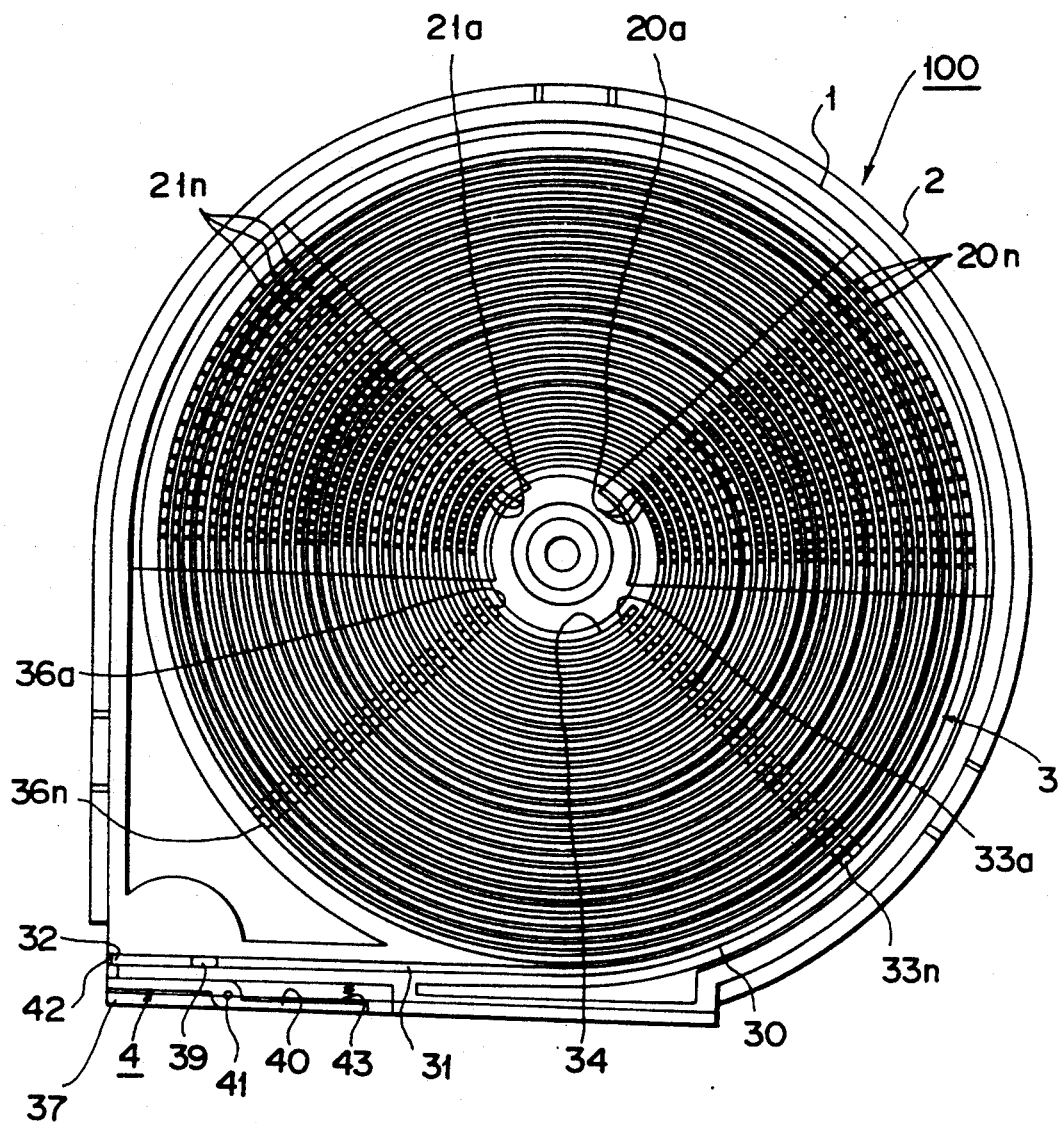
FIG. 17 is a plan view of chip packaging means according to a third embodiment.
Figure 18:
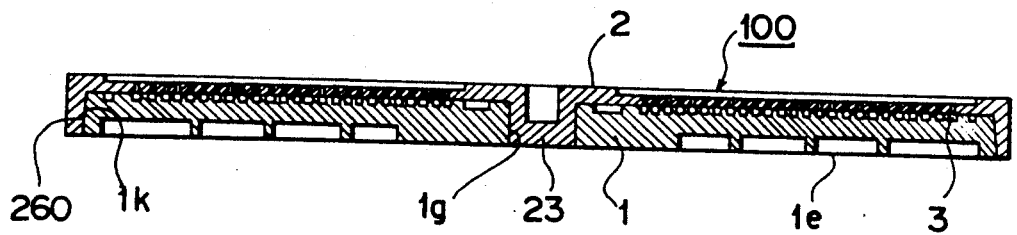
FIG. 18 is a vertical sectional view of the packaging means.
Figure 19:
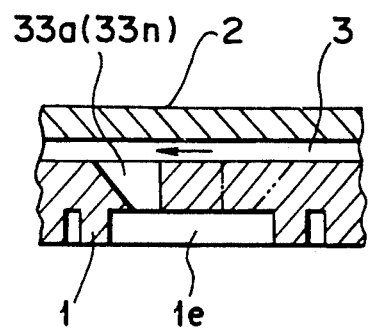
FIG. 19 is a fragmentary sectional view of the packaging means.
Figure 20:
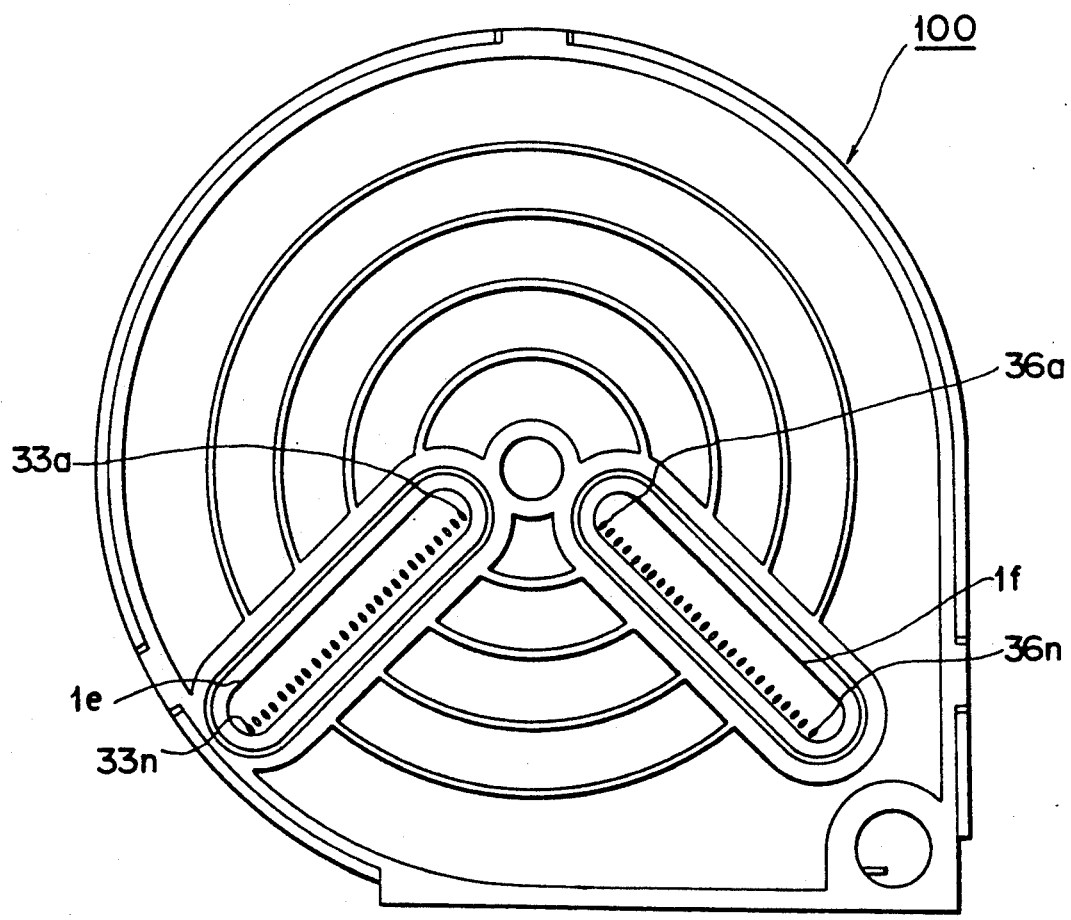
FIG. 20 is a rear elevation view of the packaging means.

As shown in FIGS. 13 and 14, the actuating mechanism 8 for actuating the shutter means 4 of the chip packaging means 100 includes a drive cylinder 80 mounted on the base 201 of the chip supply mechanism 200, and an ejector pin 81 mounted on a tip end of the rod of the drive cylinder 80.

Figure 16:
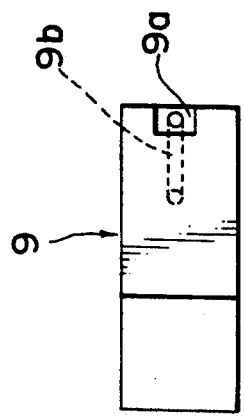
FIG. 16 is a schematic plan view of a chip receiving base.

On the base 201 of the chip supply mechanism 200, stand frames 202 and 203 for holding the chip packaging means 100 from right and left directions are mounted. The chip packaging means 100 is adapted to be located between the stand frames 202 and 203 in a manner to be interposed between the stand frames 202 and 203. The joint 73 of the air supply mechanism 7 is supported to the stand frame 203. In addition to the stand frames 202 and 203, roller guides 204 and 205 for positioning the chip packaging means 100 are supported to the base 201. In FIG. 13, reference numeral 9 designates a chip receiving base for receiving a chip discharged from the outlet 32 of the chip packaging means 100, which chip receiving base 9 is normally at a position near the outlet 32 of the chip packaging means 100. The chip receiving base 9 is attached to a bracket 90 which is mounted on a tip end of a sliding bar 91 which is slidably supported by the base 201, so that the chip receiving base 9 is adapted to be horizontally moved with movement of the sliding bar 91 which is performed by actuation of a drive cylinder 92. The sliding bar 91 has a projecting piece 93 mounted on its axis. The drive cylinder 92 is mounted on the base 201 in a manner to extend horizontally. When the drive cylinder 92 is actuated to extend its rod the latter abutted against the projecting piece 93 to cause the sliding bar 91 to be moved forward, whereby the chip receiving base 9 is also moved forward. In FIG. 13, reference numeral 94 denotes a stopper piece which extends upwardly from the base 201. The stopper piece 94 is located at a position, at which the chip receiving base 9 arrives when the rod of the drive cylinder 92 is completely extended, and adapted to be abutted against the chip receiving base 9, when the chip receiving base 9 is moved forward, to stop the further forward movement of the chip receiving base 9. As shown in FIG. 16, the chip receiving base 9 has a cutout 9a of a size sufficient to receive one chip discharged from the outlet 32 of the chip packaging means 100, and a slant air-passageway 9b extending downward from a bottom surface of the cutout 9a and connected to an air-absorbing source (not shown). The air-absorbing source serves to apply vacuum through the air-passageway 9b to a chip received in the cutout 9a to cause the chip to be held on the bottom surface of the cutout 9a during the forward movement of the chip receiving base 9, whereby the chip is prevented from jumping out of the cutout 9a during the forward movement of the chip receiving base 9. When the chip receiving base 9 stops against the stopper piece 94, the vacuum is released. Above a position at which the forward movement of the chip receiving base 9 is stopped by the stopper piece 94, a mounting head 10 is located. The mounting head 10 is adapted to be moved vertically with respect to the chip receiving base 9 and is normally in an upward position. When the chip receiving base 9 receives a chip discharged from the outlet 32 of the chip packaging means 100 and is moved forward to stop against the stopper piece 94, the mounting head 10 is synchronously moved downward to hold via suction the chip received in the cutout 9a of the chip receiving base 9 and moved upwardly to suck up the chip. Then, the mounting head 10 holding the chip via vacuum is moved toward a printed circuit board carried on an X-Y table to place the chip on the printed circuit board. In FIG. 13, a reference numeral 95 denotes a tension spring, which is stretched between the bracket 90 and a predetermined portion of the base 201. Due to the action of the tension spring 95, the sliding bar 91 is always pulled backward. When the rod of the drive cylinder 92 is retracted, the sliding bar 91 is moved backward due to the action of the tension spring 95, until the backward end of the sliding bar 91 is abutted against a stopper 96 which is mounted on the base 201. Thus, the chip receiving base 9 returns to its original position.

When the chip packaging means 100 is used, it is installed in the chip supply mechanism 200 with the chip outlet 32 being located at a lower position. The coupling 75 connected to the air valve 70 is attached onto the back side of the casing body 1 of the chip packaging means 100 in a manner such that a wall of the coupling 75 surrounding the opening of the coupling 75 surrounds the air-intakes 33a to 33n of the casing body 1. When air supplied from the air valve 70 passes through the coupling 75 to flow into the respective circular portions of the spiral groove 3 through the respective air-intakes 33a to 33n, the chips are moved along the circular portions of the groove 3 by air pressure. The chips are moved by the air pressure until the chips arrive at the positions of the groove 3 positionally corresponding to the positions of the cover plate 2, at which the air-outlets 20a to 20n are formed. When the chips arrive at the positions of the groove 3, they move downward along the respective circular portions of the groove 3 by gravity. Thus, the foremost one of the chips arrive at the outlet 32. Synchronously with the feeding of air into the respective circular portions of the groove 3 through the air-intakes 33a to 33n, the drive cylinder 80 is adapted to be actuated. When the drive cylinder 80 is actuated in a manner to extend its rod, to push the elongate body 40 of the shutter means 4 through the ejector pin 81 to cause the elongate body 40 of the shutter means 4 to be rotated about the pin 41 against action of the tension spring 43, to thereby cause the outlet 32 to be opened, the foremost chip is discharged from the outlet 32 by air to be received in the cutout 9a of the chip receiving base 9. After the chip receiving base 9 receives the chip, the drive cylinder 92 is actuated to cause the receiving base 9 to be moved forward as described above. Then, the chip received in the cutout 9a of the receiving base 9 is sucked up by the mounting head 10. After the foremost chip is discharged from the outlet 32, the rod of the drive cylinder 80 is immediately retracted, resulting in the elongate body 40 of the shutter means 4 returning to its original position due to the action of the spring 43. Thus, the outlet 32 is again closed by the stopper pawl 42 of the shutter means 4. The shutter means 4 waits until the air valve 70 operates again. Incidentally, in order to detect the completion of discharging of one chip from the outlet 32, detection means, e.g., a photosensor may be arranged near the outlet 32 of the chip packaging means 100.

Chip packaging means according to a third embodiment of the present invention is shown in FIGS. 17 to 20. In the third embodiment of FIGS. 17 to 20, parts which are similar to those shown in FIGS. 5 to 10 are designated by the same designators and the description of them will not be repeated.

Referring to FIGS. 17 to 20, the chip packaging means 100 according to the third embodiment is similar to that of the second embodiment except that the cover plate 2 is formed with a cluster of air-outlets 21a to 21n in addition to the cluster of the air-outlets 20a to 20n, the casing body 1 has a recess portion 1e of a substantially ellipse shape and a recess portion if of a substantially ellipse shape which are formed in the back side of the casing body 1 in a manner to surround the air-intakes 33a to 33n and the air-outtakes 36a to 36n, and the casing body 1 is further formed with an air-intake 39 at a portion of the linear groove 31 which is near the chip outlet 32. In the third embodiment, when all of the chips are discharged and the packaging means 100 becomes empty, new chips may be crammed into the groove 3 by feeding them through the outlet 32 into the groove 3 while supplying air. The cluster of the air-outlets 21a to 21n if formed in the cover plate 2 in the same manner as the cluster of the air-outlets 20a to 20n is formed. In the third embodiment, the cluster of the air-outlets 20a to 20n serves as means to discharge air therethrough when the chips are moved toward the chip outlet 32 by the air supplied from the air valve 70 whereas the cluster of the air-outlets 21a to 21n serves as means to discharge air therethrough when cramming of new chips into the groove 3 of the casting body 1 is performed while feeding air into the groove 3. Incidentally, when feeding of the chips toward the chip outlet 32 is carried out, the cluster of the air-outlets 21a to 21n is adapted to be covered with any suitable cover plate, whereas when new chips, are crammed into the groove 3 of the casting body 1, the cluster of the air-outlets 20a to 20n is covered with any suitable cover plate. The air-intake 39 of the casing body 1 is in a form of a slant through-hole, and formed in the casting body 1 in a manner to obliquely ascend from the back side of the casing body 1 toward the chip moving direction to communicate with a portion of the linear groove 31. The air-intake 39 is adapted to take air supplied by any suitable air supply source into the linear groove 31 therethrough so that the foremost chip can be smoothly discharged from the outlet 32 by the air.

Figure 21:
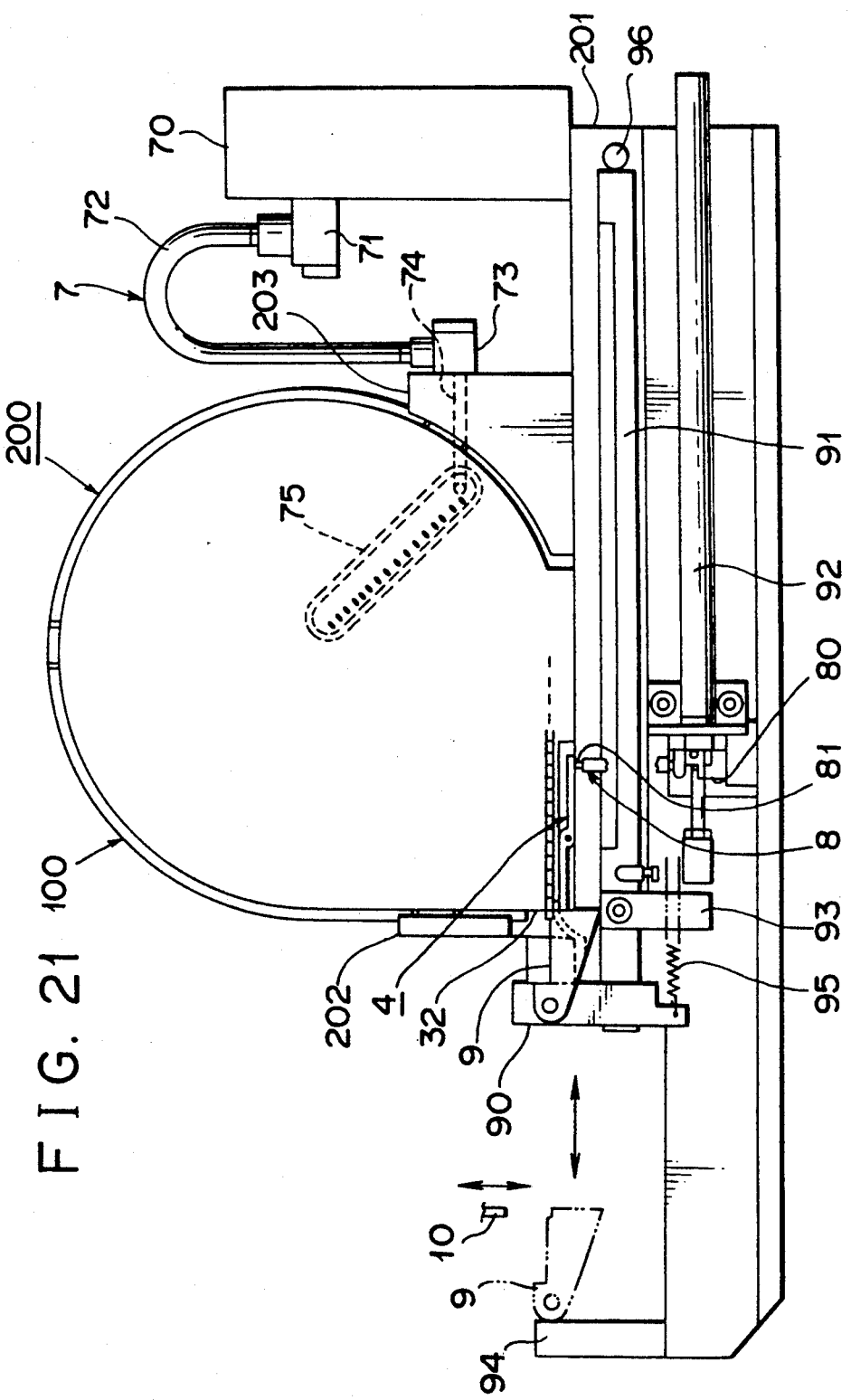
FIG. 21 is a sechematic front view of a chip supply mechanism having the chip packaging means of FIG. 17 installed therein.

A chip supply mechanism in which the chip packaging means of the third embodiment is to be installed is shown in FIG. 21 and constructed in the substantially same manner as the chip supply mechanism in FIG. 13 is constructed. The chip supply mechanism 200 includes the coupling 75 connected through the pipes to the air valve 70. The coupling 75 is shown in FIG. 22.

Figure 22:
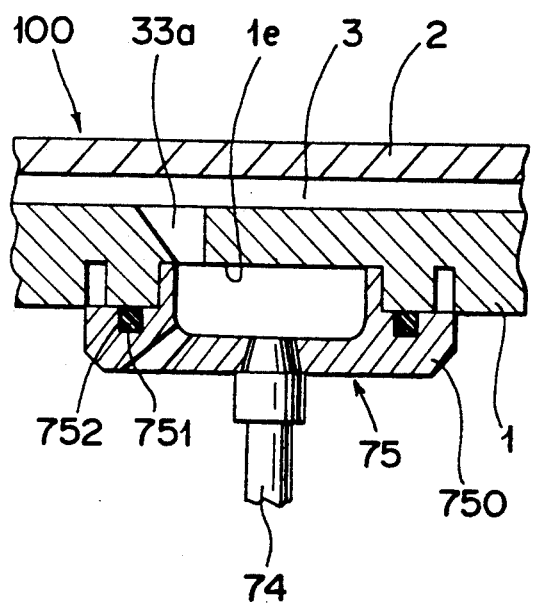
FIG. 22 is a schematic sectional view of a coupling.

Referring to FIG. 22, the coupling 75 comprises a body 750 of a substantially ellipse cup-shape which is adapted to be fitted into the ellipse recess 1e of the casing body 1. The body 750 is formed with a ring-like recess 751 at its surface portion which faces the back side of the casing body 1 when the body 750 is fitted into the recess 1e of the casing body 1, in which recess 751 an O-ring 752 is received, thereby preventing leakage of air supplied from the air valve 70.

Chip packaging means according to a fourth embodiment of the present invention is shown in FIGS. 23 to 29. In the fourth embodiment of FIGS. 23 TO 29, parts which are similar to those shown in FIGS. 17 to 20 are designated by the same designators.

Figure 23:
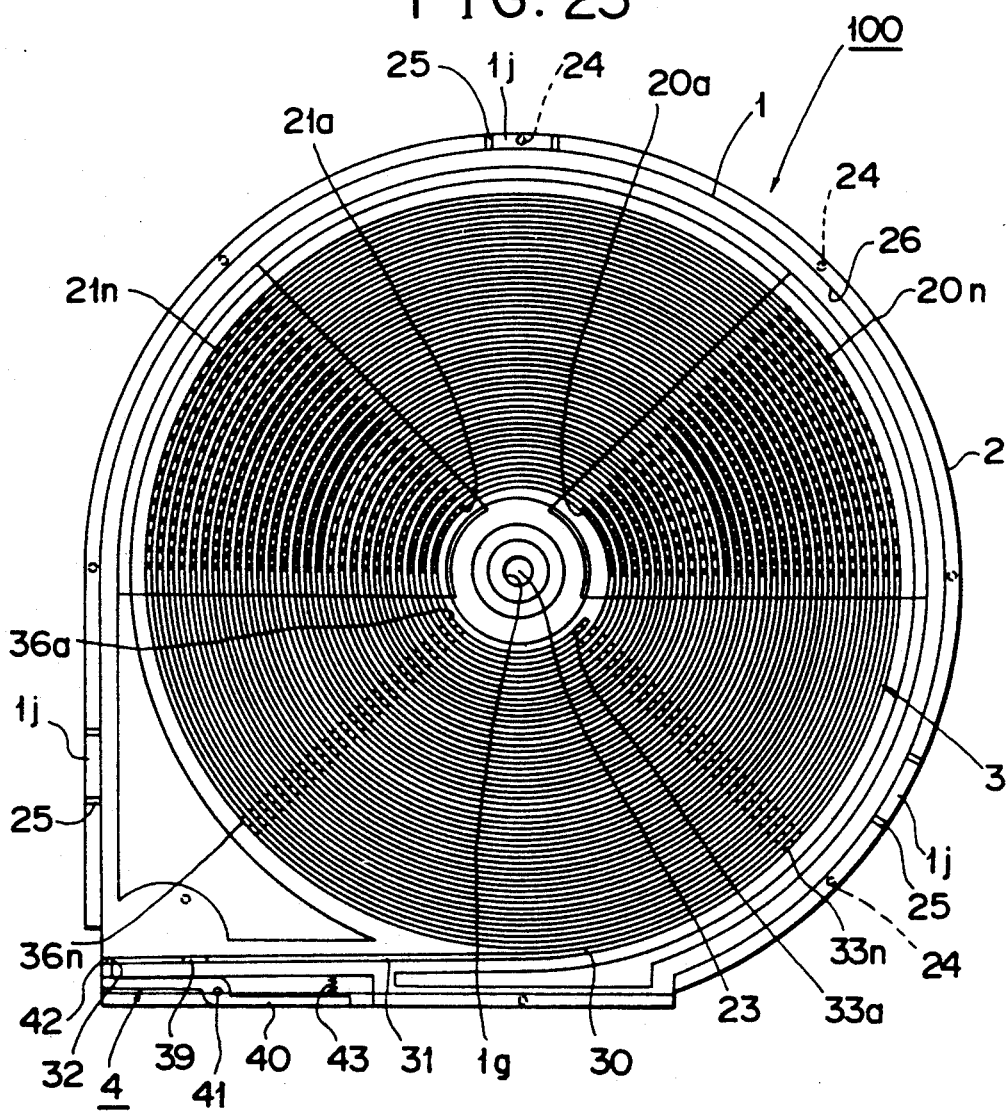
FIG. 23 is a schematic plan view of the chip packaging means according to a fourth embodiment.
Figure 24:
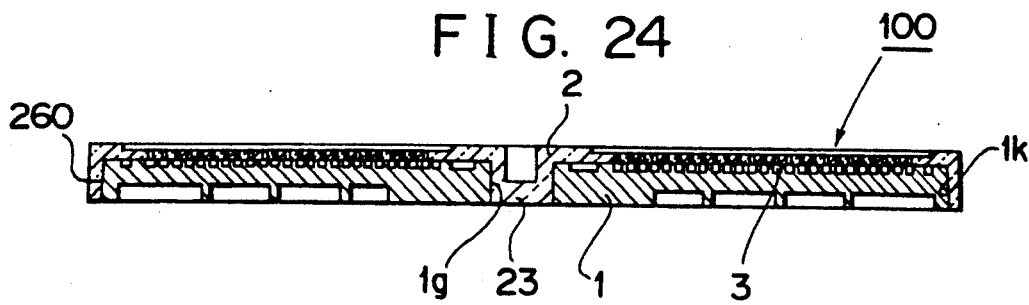
FIG. 24 is a schematic sectional view of the packaging means.
Figure 25:
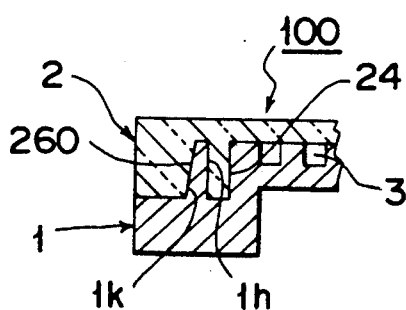
FIG. 25 is a fragmentary sectional view of the chip packaging means.
Figure 26:
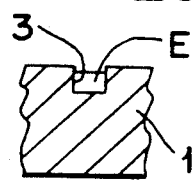
FIG. 26 is a fragmentary sectional view of a casing body of the chip packaging means.

As shown in FIGS. 23 and 24, the chip packaging means 100 includes a casing body 1 and a cover plate 2 for covering the casing body 1. The casing body 1 has a vertical through-hole 1g formed therein at its central portion and dowel holes 1h (only one is shown in FIG. 25) formed at portions near a periphery of the casing body 1. The cover plate 2 has a vertical boss portion 23 projecting downward from its central portion and pins 24 (only one is shown in FIG. 25) protruding downward from the cover plate 2 at portions of the cover plate 2 which positionally correspond to the dowel holes 1h of the casing body 1. The casing body 1 and cover plate 2 are fitted into each other by fitting the boss portion 23 of the cover plate 2 into the through-hole 1g of the casing body 1 and fitting the pins 24 of the cover plate 2 into the dowel holes 1h of the casing body 1. Also, the casing body 1 has protruding pieces 1j formed at its positions around the casing body 1, whereas the cover plate 2 has cutouts 25 formed at portions of its peripheral rising portion 26 which positionally correspond to the protruding pieces 1j of the casing body 1, thereby facilitating the fitting operation of the cover plate 2 and the casing body 1. Further, a peripheral portion of the casing body 1 is formed with a peripheral tapered surface 1k, whereas the rising portion 26 of the cover plate 2 is formed at its inner surface with a mating peripheral tapered surface 260, thereby also facilitating the fitting operation of the cover plate 2 and the casing body 1. The casing body 1 has groove 3 of a substantially spiral shape in which a plurality of chips are received in a row in a state of facing in a predetermined direction. This groove 3 is of a substantially U-shape in vertical section which corresponds to the shape of each of the chips E as shown in FIG. 26 and extends from the central portion of the casing body 1 to the peripheral portion of the casing body 1. An outside terminal portion 30 of the spiral groove 3 communicates through linear groove 31 with chip outlet 32.

Figure 27:
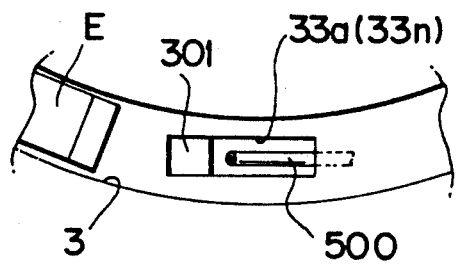
FIG. 27 is a fragmentary plan view of the casing body.
Figure 28:
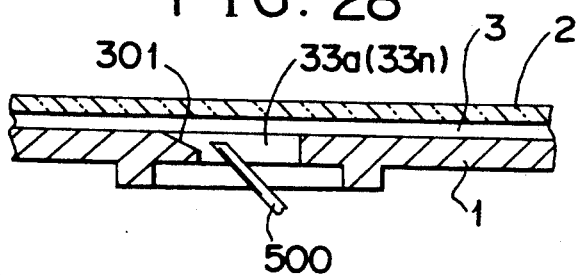
FIG. 28 is a fragmentary sectional view of the chip packaging means.

The casing body 1 further has a series of first elongate through-holes 33a to 33n formed therein along its radial directions from the central portion of the casing body 1 and located at the bottom portions of respective circular portions of the spiral groove 3, each of which first through-holes 33a to 33n is of substantially rectangular shape as shown in FIG. 27, and is of a size less than a width of each of the chips, into each of which first through-holes 33a to 33n a tip end of an air nozzle 500 (see FIGS. 27 and 28) is inserted. The air nozzle 500 obliquely extends in the chip moving direction. As shown in FIG. 28, each of the first through-holes 33a to 33n is preferably formed at its wall with a rising slope surface 301 ascending in the direction of the chips being moved by air from the air nozzle 500. Also, the first through-holes 33a to 33n, as shown in FIG. 23, are preferably formed at the lower half area of the casing body 1. The lower half area of the casing body 1 has a series of second through-holes 36a to 36n formed therein in the same manner as the first through-holes 33a to 33n are made, which series of the second through-holes 36a to 36n are separated from the series of the first through-holes at a desirable angular space. In each of the second through-holes 36a to 36n, an air nozzle is inserted at its tip portion, with the tip portion of the nozzle being inclined in the direction opposite to an inclining direction of the nozzle 500 inserted in each of the first through-holes 33a to 33n. In order to maintain the inclination of each nozzle, each of the second through-holes 36a to 36n is formed at its wall with a rising slope surface ascending in the direction reverse to the inclining direction of the rising slope surface 301 of each of the first through-holes 33a to 33n. The first and second through-holes serve to take air supplied by the above described nozzles into the groove 3 therethrough in order to cause the chips to be moved toward the outlet 32 along the groove 3 by the air as will be decribed later.

Figure 29:
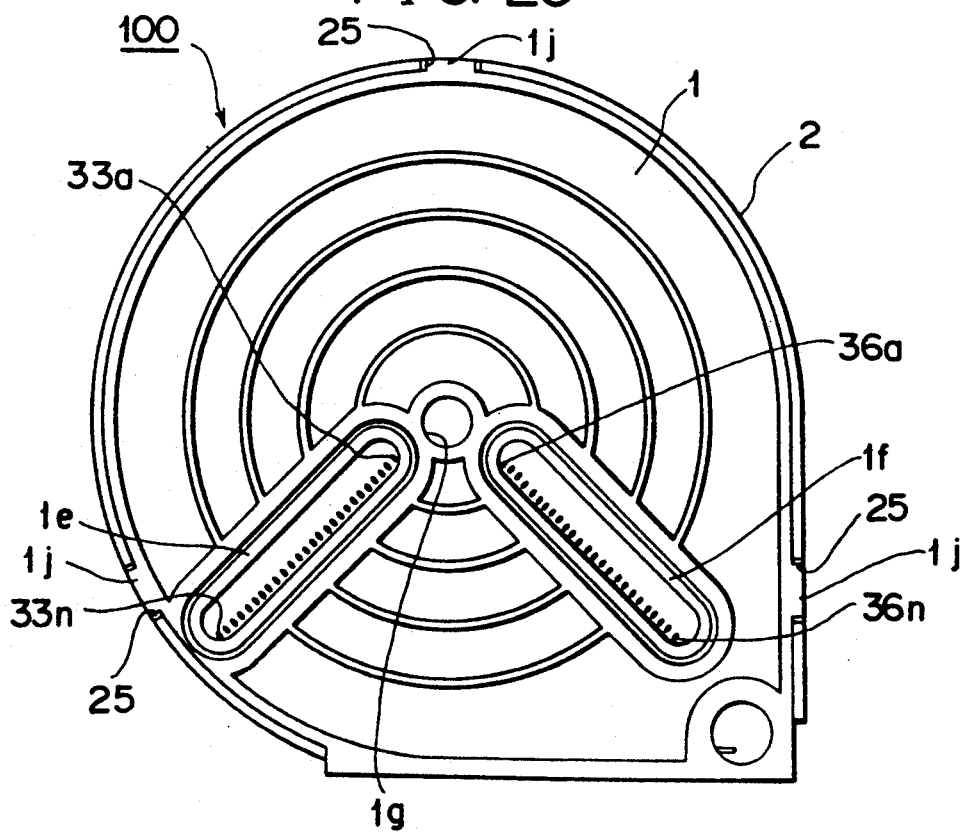
FIG. 29 is a rear elevation view of the chip packaging means.

As shown in FIG. 29, the casing body 1 further has a first frame portion 1e of a substantially ellipse shape and a second frame portion 1f of a substantially ellipse shape which are formed on the back side of the casing body 1, which first and second frame portions 1e and 1f are arranged in a manner to surround the series of the first through-holes 33a to 33n and series of the second through-holes 36a to 36n, respectively. Couplings (described in greater detail later) for binding together the air nozzles described above are fitted in the respective frame portions 1e, 1f. Also, the cover plate 2 has a series of third through-holes 20a to 20n and series of fourth through-holes 21a to 21n which are formed at the upper half area of the cover plate 2 as shown in FIG. 23. Each of the third and fourth through-holes serves as means to discharge air supplied from the above described air nozzles into the groove 3. The third and fourth through-holes 20a to 20n, 21a to 21n are formed in rows in radial directions from the central portion of the cover plate 2.

Figure 30:
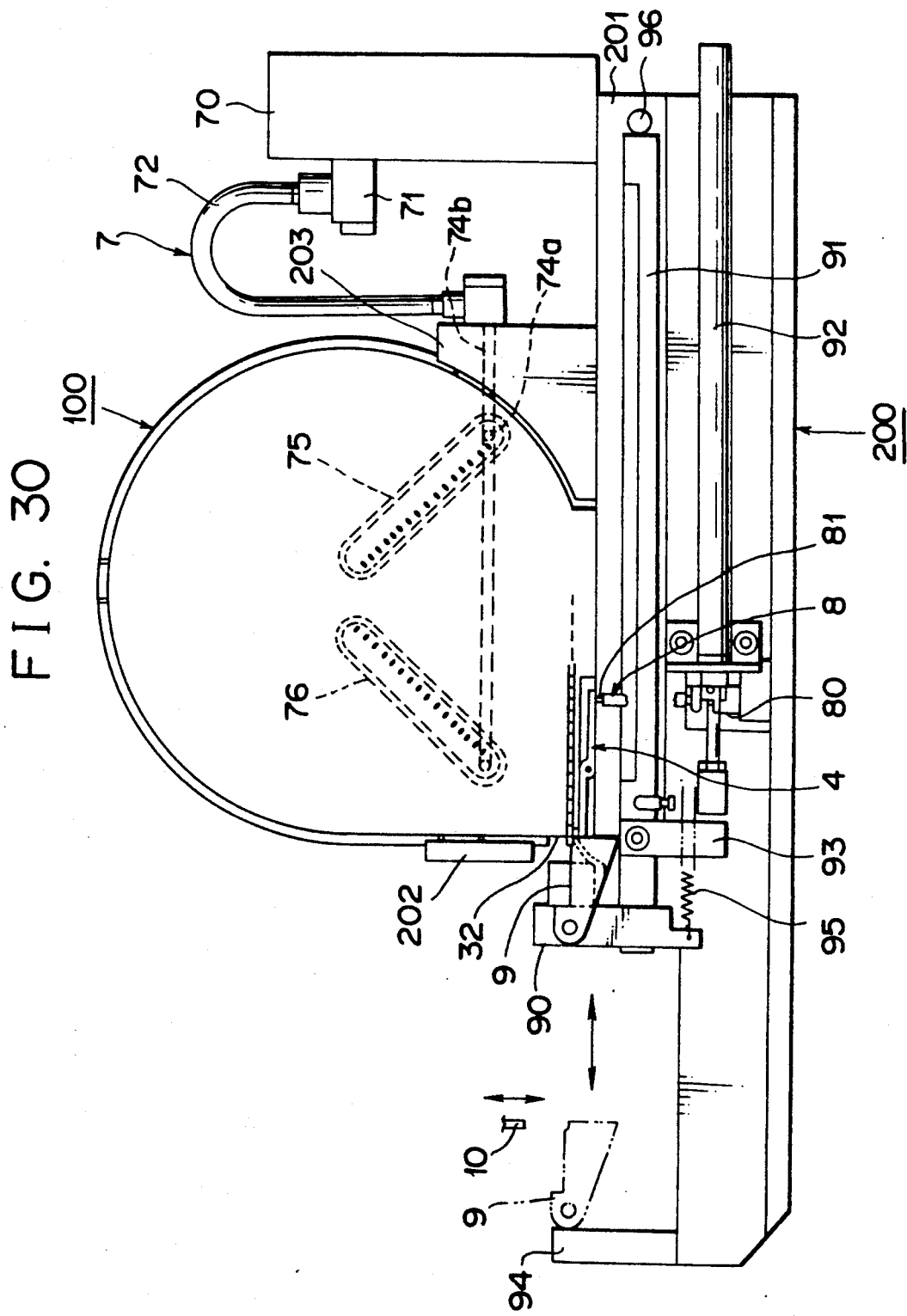
FIG. 30 is a front view of a chip supply mechanism having the chip packaging means of FIG. 23 installed therein.

Since the remaining parts of the chip packaging means 100 of the fourth embodiment are similar to those of the third embodiment, the description of them will not be repeated. Referring now to FIG. 30, there is shown a chip supply mechanism in which the chip packaging means 100 of the fourth embodiment is to be installed. In FIG 30, parts which are similar to those shown in FIG. 21 are designated by the same designators.

Figure 31:
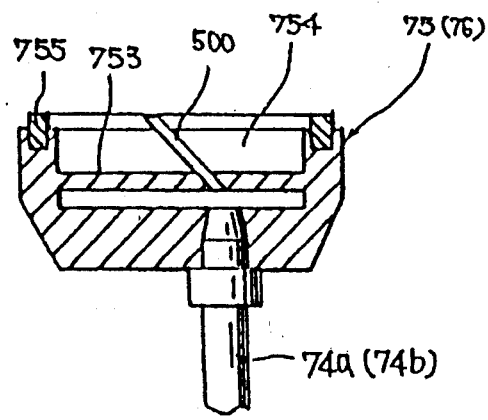
FIG. 31 is a vertical sectional view of a coupling.

The air supply mechanism 7 of the chip supply mechanism 200 includes an air valve 70 mounted on a base 201 of the chip supply mechanism 200 and having a joint 71, a connecting pipe 72 connected as its one end to the joint 71, and a branched pipe having a first pipe 74a and a secoond pipe 74b and connected to the other end of the connecting pipe 72. To each tip end of the pipes 74a, 74b, a coupling 75 (or 76) having an opening of a size sufficient to surround the first through-holes 33a to 33n of the chip packaging means 100 (or the second through-holes 36a to 36n) is connected. The coupling 75 (or 76) as shown in FIG. 31 includes a substantially cup shaped body 750 which is fitted into the frame portion 1e (or 1f) of the casing body 1. Also, the coupling 75 or 76 is provided its interior with a partition wall 753 for dividing the interior into an opening side 754 and a side connected to the pipe 74a (or 74b) of the branched pipe. A plurality of the air nozzles 500 (only one is shown in FIG. 31) corresponding in number to the first through-holes 33a to 33n of the chip packaging means 100 (or the second through-holes 36a to 36n) are supported to the partition 753 with their tip ends facing toward the opening side. Each of the air nozzles 500 is oblique at 45° to the partition 753. In order to provide airtightness, a rubber ring 755 of a substantially O-shape is mounted on the opening side of the coupling 75 (or 76). The couplings 75 and 76 may be connected to any suitable drive means and, when the packaging means 100 is installed in the removed from the chip supply mechanism 200, the couplings 75 and 76 approach or are moved away from the back side of the casing body 1 by the actuation of the drive means. Since the remaining parts of the chip supply mechanism 200 are similar to those shown in FIG. 21, the description of them will not be repeated.

The packaging means 100 is adapted to be mounted on the base 201 with the chip outlet 32 being located at a lower position. The couplings 75 and 76 are attached onto the back side of the casing body 1 in a manner to be fitted into the frames 1e, 1f, respectively. When air is supplied each air nozzle 500 from the air valve 70, the air is fed into the groove 3 through the first through-holes 33a to 33n and the second through-holes 36a to 36n, whereby the chips received in the spiral groove 3 are moved along the respective circular portions of the groove 3 toward the upper half area of the casing body 1. When supplying of air into the groove 3 is stopped, the chips are moved along the respective circular portions of the groove 3 toward the lower half area of the casing body 1. Such movement of the chips is repeated in a predetermined interval of time by feeding air in opposite directions by means of the couplings 75 and 76. At this time, air supplied from the couplings 75 and air supplied from the coupling 76 flow into the groove 3 in a manner to be opposited to each other, so that when the air supplied from the coupling 75 and the air supplied from the coupling 76 strike each other, repulsive force is produced in the groove 3, resulting in the halves of the chips and other halve in a clockwise direction and a counterclockwise direction, respectively. When foremost chips of the halves moved in the clockwise direction and foremost chips of the other halves moved in the counterclockwise direction strike one another at central portions of the upper half of the casing body 1, the chips are gradually moved toward the outside terminal portion 30 of the groove 3 by gravity. Air supplied from the couplings 75 and 76 is discharged through the third through-holes 20a to 20n and fourth through-holes 21a to 21n. At this time, the chips are moved downward along the groove 3 by gravity. When the chips are moved downwardly in the manner as described above, a foremost chip reaching the linear groove 31 is moved toward the outlet 32 by air jetting from the air-intake 39. Thus, the chip is discharged from the outlet 32 which is opened by the shutter means 4 at this time.

Figure 32:
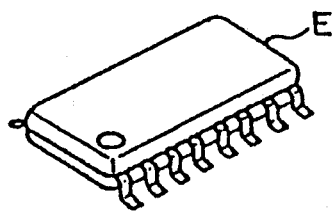
FIG. 32 is a perspective view of a special-type chip.
Figure 33:
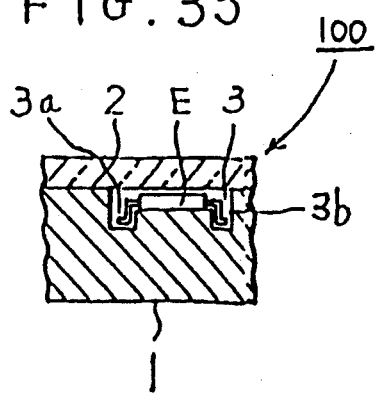
FIG. 33 is a fragmentary sectional view of chip packaging means packin the special-type chip of FIG. 32.

In the case where the chip packaging means 100 packs a plurality of special-type chips E each having a body E1 and leads E2 downwardly projecting therefrom (see FIG. 32), the spiral groove 3 may be formed in a manner to have recess portions 3a and 3b for receiving the leads of the special-type chips at its both sides as shown in FIG. 33.

Thus, it will be noted that the chip packaging means of the present invention provides easy and efficient feeding of chips to a chip mounting head of an automatic mounting head.

It will thus be seen that the objects set forth above, and those made apparent from the preceding description, are efficiently attained and, since certain changes may be made in the above construction without departing from the scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. Chip packaging means packing chips and also serving as a chip supply source, comprising:
   a substantially plate-like body having a substantially spiral passageway formed in its interior and an outlet formed therein as a continuation of said spiral passageway to communicate with the exterior of said body;
   a plurality of chips received in a row in said spiral passageway of said body; and
   means for facilitating forwarding of said chips along said passageway to said outlet to discharge said chips from said outlet.

2. Chip packaging means as defined in claim 1, wherein said plate-like body is made of transparent material.

3. Chip packaging means as defined in claim 1, wherein said spiral passageway gradually descends from its innermost circular portion to its outermost circular portion.

4. Chip packaging means as defined in claim 1, and further including shutter means for closing and opening said outlet, synchronously with the forwarding of said chips, to facilitate discharging of said chips one by one from said outlet.

5. Chip packaging means as defined in claim 1, wherein said means for facilitating forwarding of said chips comprises at least one air-intake, said at least one air-intake being formed at a bottom of an innermost circular portion of said spiral passageway to communicate with the exterior of said plate-like body and adapted to be connected to an air supply source.

6. Chip packaging means as defined in claim 5, and further including an air-outtake formed in said plate-like body, said air-outtake communicating between a predetermined portion of said passageway and the exterior of said plate-like body.

7. Chip packaging means as defined in claim 5, wherein said at least one air-intake takes the form of an elongate hole and obliquely extends in the chip forwarding direction.

8. Chip packaging means as defined in claim 1, wherein said means for facilitating forwarding of said chips comprises a plurality of air-intakes, said air-intakes being formed at bottoms of respective circular portions of said spiral passageway to communicate with the exterior of said plate-like body and being adapted to be connected to an air supply source.

9. Chip packaging means as defined in claim 8, and further including a plurality of air-outtakes formed in said plate-like body, said air-outtakes communicating between predetermined portions of said passageway and the exterior of the plate-like body.

10. Chip packaging means as defined in claim 8, wherein each of said air-intakes takes the form of an elongate hole an obliquely extends in the chip forwarding direction.

11. Chip packaging means as defined in claim 1, wherein said means for facilitating forwarding of said chips comprises at least one air-intake, said at least one air-intake being formed at a bottom of an innermost circular portion of said spiral passageway to communicate with the exterior of said plate-like body, and wherein said plate-like body a recess portion which is formed in a surface portion of said plate-like body in a manner to surround said at least one air-intake, in which recess portion a coupling connected to an air supply source is adapted to be fitted.

12. Chip packaging means as defined in claim 11, and further including an air-outtake formed in said plate-like body, said air-out-take communicating between a predetermined portion of said passageway and the exterior of said plate-like body.

13. Chip packaging means as defined in claim 11, wherein said at least one air-intake takes the form of an elongate hole and obliquely extends in the chip forwarding direction.

14. Chip packaging means as defined in claim 1, wherein said means for facilitating forwarding of said chips comprises a plurality of air-intakes, said air-intakes being formed at bottoms of respective circular portions of said spiral passageway to communicate with the exterior of said plate-like body, and wherein said plate-like body has a recess portion which is formed in a surface portion of said plate-like body in a manner to surround said air-intakes, in which recess portion a coupling connected to an air supply source is adapted to be fitted.

15. Chip packaging means as defined in claim 14, and further including a plurality of air-outtakes formed in said plate-like body, said air-outtakes communicating between predetermined portions of said passageway and the exterior of said plate-like body.

16. Chip packaging means as defined in claim 14, wherein each of said air-intakes takes the form of an elongate hole and obliquely extends in the chip forwarding direction.

17. Chip packaging means as defined in claim 1, wherein said means for facilitating forwarding of said chips comprises at least one air-intake, said at least one air-intake being formed at a bottom of an innermost circular portion of said spiral passageway to communicate with the exterior of said plate-like body, and wherein said plate-like body has a frame portion which is formed on a surface portion of said plate-like body in a manner to surround said at least one air-intake, in which frame portion a coupling connected to an air supply source is adapted to be fitted.

18. Chip packaging means as defined in claim 17, and further including an air-outtake formed in said plate-like body, said air-outtake communicating between a predetermined portion of said passageway and the exterior of said plate-like body.

19. Chip packaging means as defined in claim 17, wherein said at least one air-intake takes the form of an elongate hole and obliquely extends in the chip forwarding direction.

20. Chip packaging means as defined in claim 1, wherein said means for facilitating forwarding of said chips comprises a plurality of air-intakes, said air-intakes being formed at bottoms of respective circular portions of said spiral passageway to communicate with the exterior of said plate-like body, and wherein said plate-like body has a frame portion which is formed on a surface portion of said plate-like body in a manner to surround said air-intakes, in which frame portion a coupling connected to an air supply souce is adapted to be fitted.

21. Chip packaging means as defined in claim 20, and further including an air-outtake formed in said plate-like body, said air-outtake communicating between a predetermined portion of said passageway and the exterior of said plate-like body.

22. Chip packaging means as defined in claim 20, and further including a plurality of air-outtakes formed in said plate-like body, said air-outtakes communicating between predetermined portions of said passageway and the exterior of said plate-like body.

23. Chip packaging means as defined in claim 20, wherein each of said air-intakes takes the form of an elongate hole and obliquely extends in the chip forwarding direction.

24. Chip packaging means as defined in claim 1, wherein said means for facilitating forwarding of said chips comprises at least one air-intake, said at least one air-intake being formed at a bottom of an innermost circular portion of said spiral passageway to communicate with the exterior of said plate-like body and adapted to receive an air nozzle connected to an air supply source.

25. Chip packaging means as defined in claim 1, wherein said means for facilitating forwarding of said chips comprises a plurality of air-intakes, said air-intakes being formed at bottoms of respective circular portions of said passageway to communicate with the exterior of said plate-like body and being adapted to receive air nozzles connected to an air supply source.

26. Chip packaging means as defined in claim 1, wherein said plate-like body comprises a base portion and a cover plate portion, wherein said spiral passageway is a spiral groove, said spiral groove being formed in one surface side of said base portion, said cover plate portion being removably mounted on a spirally grooved surface of said base portion, and wherein said outlet is formed in said base portion as a continuation of an outermost circular portion of said spiral groove.

* * * * *